United States Patent
Yoshida

[19]

[11] Patent Number: 5,990,731
[45] Date of Patent: Nov. 23, 1999

[54] INPUT/OUTPUT PROTECTION CIRCUIT

[75] Inventor: Kousuke Yoshida, Tokyo, Japan

[73] Assignee: NEC Corporation, Tokyo, Japan

[21] Appl. No.: 09/017,862

[22] Filed: Feb. 3, 1998

[30] Foreign Application Priority Data

Feb. 4, 1997 [JP] Japan ................................... 9-021611

[51] Int. Cl.$^6$ ....................................................... G05F 1/10
[52] U.S. Cl. ............................ 327/545; 327/546; 327/504
[58] Field of Search ..................................... 327/545, 546, 327/564, 565, 309, 310, 333, 504, 514

[56] References Cited

U.S. PATENT DOCUMENTS

| | | | |
|---|---|---|---|
| 5,059,782 | 10/1991 | Fukuyama ............................ | 250/214 A |
| 5,289,056 | 2/1994 | Keown et al. ........................... | 326/113 |
| 5,424,673 | 6/1995 | Edwards et al. ........................ | 327/530 |
| 5,461,297 | 10/1995 | Crawford ................................ | 320/1 |
| 5,591,992 | 1/1997 | Leach ..................................... | 257/173 |
| 5,594,382 | 1/1997 | Kato et al. .............................. | 327/541 |
| 5,821,528 | 10/1998 | Liao et al. .............................. | 250/214 R |
| 5,875,089 | 2/1999 | Higashide et al. ..................... | 361/111 |

*Primary Examiner*—Timothy P. Callahan
*Assistant Examiner*—An T Luu
*Attorney, Agent, or Firm*—Young & Thompson

[57] ABSTRACT

Input/output circuitry for electrically protecting an internal element includes an input/output terminal connected to the internal element, a pair of first and second power terminals applied with a bias voltage, a series connection of a diode and a bipolar transistor between the pair of first and second power terminals so that an intermediate point between the diode and the bipolar transistor is connected to the input terminal, and a parasitic resistance connected between a base of the bipolar transistor and the diode so that the diode is connected between the parasitic resistance and an emitter of the bipolar transistor. An electrostatic pulse applied to the input/output terminal is clamped by the series connection of the diode and the bipolar transistor to protect the internal element from an electrostatic pulse applied to the input/output terminal.

6 Claims, 7 Drawing Sheets

INPUT/OUTPUT PROTECTION CIRCUIT

BACKGROUND OF THE INVENTION

The present invention relates to an input/output protection circuit for protecting an internal element.

A conventional input/output protection circuit will be described with reference to FIGS. 1A and 1B. FIG. 1A is a fragmentary plane view illustrative of the conventional input/output protection circuit FIG. 1B is a fragmentary cross sectional elevation view taken along an line IB—IB of FIG. 1A. The conventional input/output protection circuit is formed on a p-type semiconductor substrate 501. The conventional input/output protection circuit has a p-channel MOS off-buffer diode region 530 and an n-channel MOS off-buffer diode region 540. An n-well region 535 is selectively formed in an upper region of the p-channel MOS off-buffer diode region 530 in the p-type semiconductor substrate 501. Field oxide films 505 are selectively formed on a surface of the p-type semiconductor substrate 501 so that the field oxide films 505 define first and second active regions in the p-channel MOS off-buffer diode region 530 and the n-channel MOS off-buffer diode region 540 respectively. A p-channel MOS off-buffer diode is formed in the first active region in the p-channel MOS off-buffer diode region 530. An n-channel MOS off-buffer diode is formed in the second active region in the n-channel MOS off-buffer diode region 540. An inter-layer insulator 506 is formed which extends over the field oxide films 505 and the p-channel and n-channel MOS off-buffer diodes in the first and second active regions. An input/output pad 502 is selectively formed on the inter-layer insulator 506 in a region spaced from the p-channel and n-channel MOS off-buffer diode region 530 and 540. A high voltage power interconnection 503 is formed in the p-channel MOS off-buffer diode region 530. A low voltage power interconnection 504 is formed in the n-channel MOS off-buffer diode region 540. The p-channel MOS off-buffer diode has a looped gate electrode 531 which is connected to the high voltage power interconnection 503. The p-channel MOS off-buffer diode also has a p-type drain region 532 with a high impurity concentration which is connected to the input/output pad 502 and also connected to the looped gate electrode 531. The p-channel MOS off-buffer diode also has a p-type source region 533 with a high impurity concentration which extends around the p-type drain region 532 and which is connected to the high voltage power interconnection 503 and also connected to the looped gate electrode 531. The p-channel MOS off-buffer diode also has an n-type back gate 534 with a high impurity concentration which extends around the p-type source region 533 and which is connected to the p-type source region 533 and the field oxide film 505. The n-channel MOS off-buffer diode has a looped gate electrode 541 which is connected to the low voltage power interconnection 504. The p-channel MOS off-buffer diode also has an n-type drain region 542 with a high impurity concentration which is connected to the input/output pad 502 and also connected to the looped gate electrode 541. The p-channel MOS off-buffer diode also has an n-type source region 543 with a high impurity concentration which extends around the n-type drain region 542 and which is connected to the low voltage power interconnection 504 and also connected to the looped gate electrode 541. The p-channel MOS off-buffer diode also has a p-type back gate 544 with a high impurity concentration which extends around the n-type source region 543 and which is connected to the n-type source region 543 and the field oxide film 505. The above prior art is disclosed in Japanese laid-open patent publication No. 63-202056.

The p-type drain region 532 is surrounded by the p-type source region 533 and the n-type back gate 534 in order to separate or distance the p-type drain region 532 from the outside portion whereby an electrostatic pulse and the like are absorbed in the p-channel MOS off-buffer diode. Also the n-type drain region 542 is surrounded by the n-type source region 543 and the p-type back gate 544 in order to separate or distance the n-type drain region 542 from the outside portion whereby an electrostatic pulse and the like are absorbed in the n-channel MOS off-buffer diode.

In recent years, the number of input/output terminals has been on the increase. In this case, it might have been required to narrow a pitch of the input/output terminals, wherein a protection circuit is connected to each of the input/output terminals. The provisions of the protection circuits for the individual input/output terminals result in the increase in chip area, for which reason it is required to scale down or shrink the individual protection circuits.

In order to reduce the occupied area of the individual protection circuit, it is required to reduce a distance between the p-channel and n-channel MOS diodes used as the protection circuits.

FIG. 2 is a circuit diagram illustrative of an equivalent circuit of the input/output protection circuit of FIGS. 1A and 1B. An input terminal 602 is connected to an internal element 606. The equivalent circuit has a series connection of the p-channel and n-channel MOS off-buffer diodes 630 and 640 between the high voltage power terminal 603 and the low voltage power terminal 604 which is grounded. The p-channel MOS off-buffer diode 630 is connected to the high voltage power terminal 603. The n-channel MOS off-buffer diode 640 is connected to the low voltage power terminal 604. The input terminal is connected between the p-channel and n-channel MOS off-buffer diodes 630 and 640. The p-channel MOS off-buffer diode 630 has a parasitic n-well resistance 635. The n-channel MOS off-buffer diode 640 has a parasitic p-well resistance 645. The internal element is connected to the high voltage power terminal 603 and also connected to the ground line. A parasitic thyristor 607 is further formed between the p-channel and n-channel MOS off-buffer diodes 630 and 640. Since the parasitic thyristor 607 is formed, it is required for suppression of the operation of the parasitic thyristor 607 to ensure a sufficient distance between the p-channel and n-channel MOS off-buffer diodes.

In contrast, however, in order to increase the density of integration of the circuits, it is required to narrow the distance between the p-channel and n-channel MOS off-buffer diodes. Narrowing the distance between the p-channel and n-channel MOS off-buffer diodes, however, results in a certain possibility of operation of the parasitic thyristor due to a trigger of external noise whereby a problem with a latch-up generation is raised.

In the above circumstances, it had been required to develop a novel input/output protection circuit free from the above problems as described above.

SUMMARY OF THE INVENTION

Accordingly, it is an object of the present invention to provide a novel input/output protection circuit free from the above problems.

It is a further object of the present invention to provide a novel input/output protection circuit having a reduced distance between p-channel and n-channel MOS diodes for increasing the density of integration of the input/output protection circuit without, however, causing any parasitic thyristor to be operated.

The above and other objects, features and advantages of the present invention will be apparent from the follow description.

The present invention provides an input/output circuitry for electrically protecting an internal element. The circuitry includes an input/output terminal connected to the internal element, a pair of first and second power terminals applied with a bias voltage, a series connection of a diode and a bipolar transistor between the pair of first and second power terminals so that an intermediate point between the diode and the bipolar transistor is connected to the input terminal, and a parasitic resistance connected between a base of the bipolar transistor and the diode so that the diode is connected between the parasitic resistance and an emitter of the bipolar transistor. An electrostatic pulse applied to the input/output terminal is clamped by the series connection of the diode and the bipolar transistor to protect the internal element from an electrostatic pulse applied to the input/output terminal.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1A:
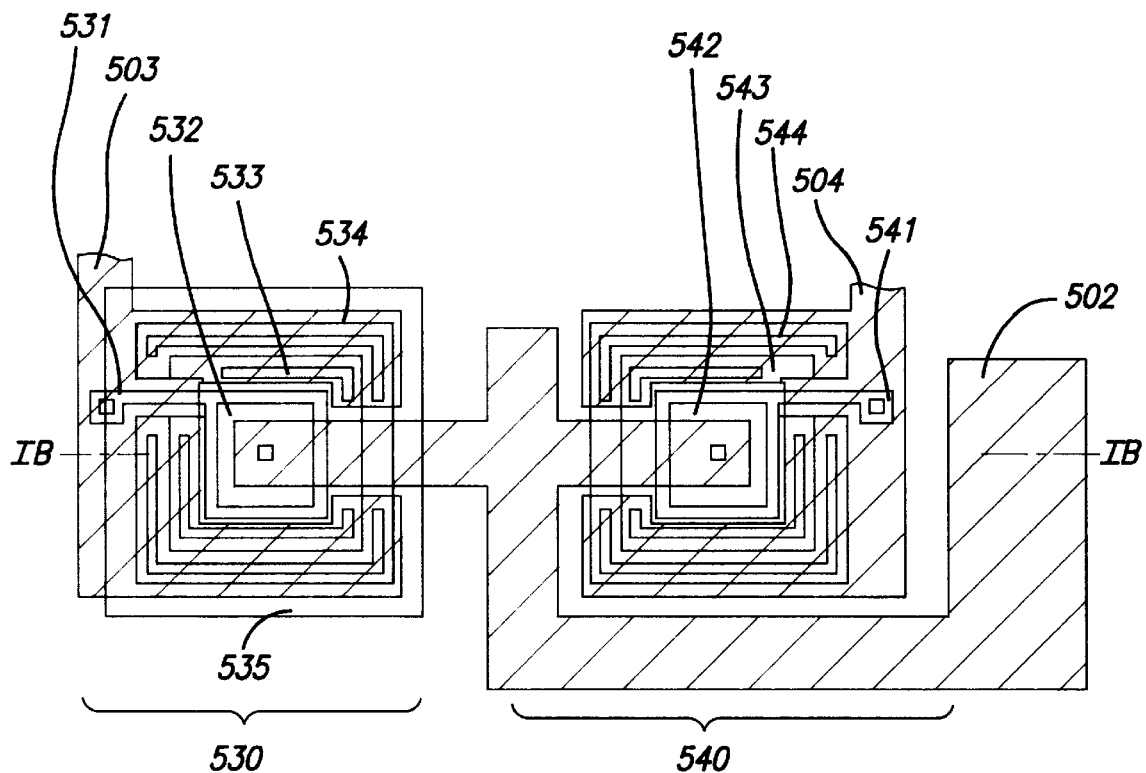
FIG. 1A is a fragmentary plan view illustrative of the conventional input/output protection circuit.
Figure 1B:
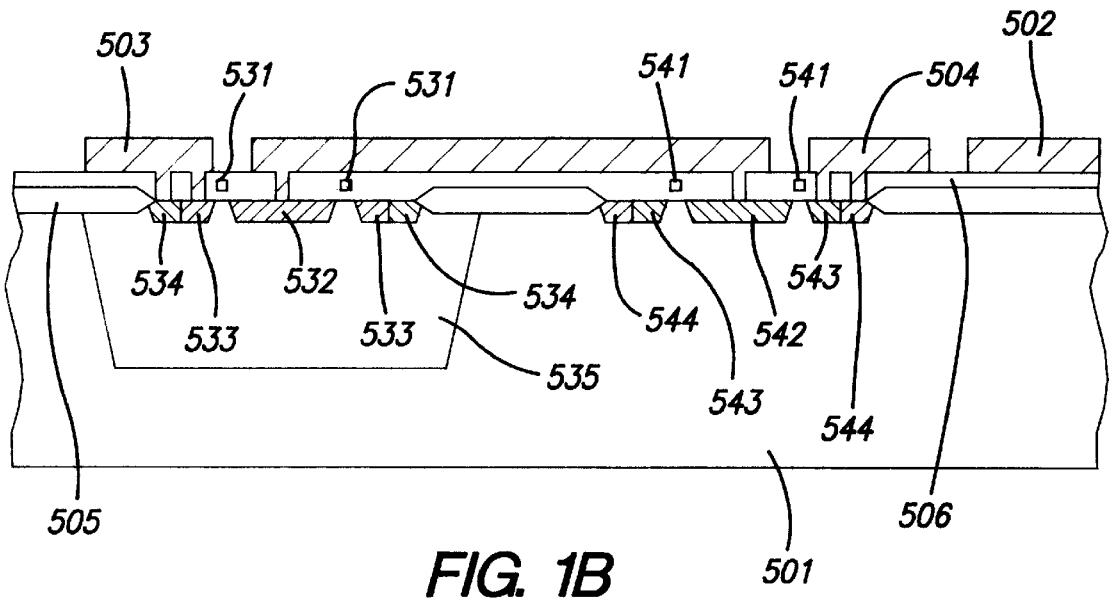
FIG. 1B is a fragmentary cross sectional elevation view taken along an IB—IB line of FIG. 1A.
Figure 2:
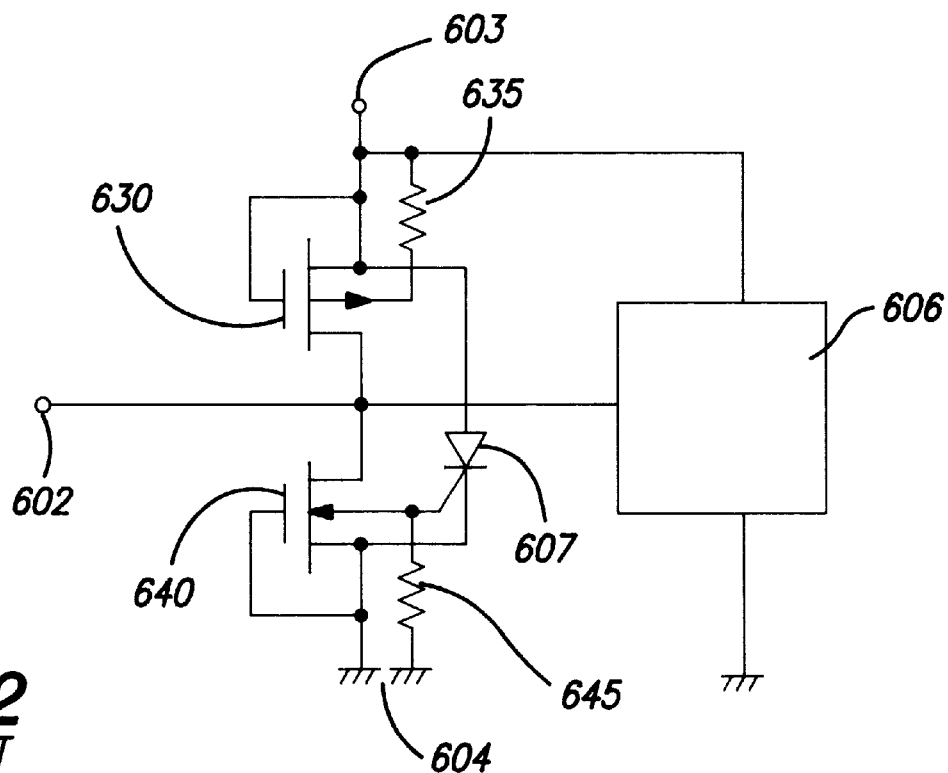
FIG. 2 is a circuit diagram illustrative of an equivalent circuit of the input/output protection circuit of FIGS. 1A and 1B.

The present invention provides an input/output circuit for electrically protecting an internal element. The circuit includes an input/output terminal connected to the internal element, a pair of first and second power terminals applied with a bias voltage, a series connection of a diode and a bipolar transistor between the pair of first and second power terminals so that an intermediate point between the diode and the bipolar transistor is connected to the input terminal, and a parasitic resistance connected between a base of the bipolar transistor and the diode so that the diode is connected between the parasitic resistance and an emitter of the bipolar transistor. An electrostatic pulse applied to the input/output terminal is clamped by the series connection of the diode and the bipolar transistor to protect the internal element from an electrostatic pulse applied to the input/output terminal.

It is preferable that the first power terminal has a first voltage level which is higher than a second voltage level of the second power terminal, the bipolar transistor is a p-n-p bipolar transistor, the diode is connected between the first power terminal and the emitter of the bipolar transistor, and that a collector of the bipolar transistor is connected to the second power terminal.

It is also preferable that the first power terminal has a first voltage level which is higher than a second voltage level of the second power terminal, the bipolar transistor is an n-p-n bipolar transistor, the diode is connected between the second power terminal and the emitter of the bipolar transistor, and that a collector of the bipolar transistor is connected to the first power terminal.

It is also preferable that the bipolar transistor, the diode and the parasitic resistance are interrelated within a single well region of a first conductivity type formed in a semiconductor substrate of a second conductivity type. In this case, the collector of the bipolar transistor comprises a high impurity concentration second conductivity type collector layer formed on a surface of the well region. The emitter of the bipolar transistor comprises two high impurity concentration second conductivity type emitter layers being formed on the surface of the well region so that the two high impurity concentration second conductivity type emitter layers are separated from and positioned in both sides of the high impurity concentration first conductivity type collector layer. The base of the bipolar transistor comprises two high impurity concentration first conductivity type emitter layers formed on the surface of the well region so that the two high impurity concentration second conductivity type emitter layers are separated from and positioned in both sides of the two high impurity concentration second conductivity type emitter layers.

It is also preferable that the bipolar transistor, the diode and the parasitic resistance are interrelated within and in the vicinity of a single well region of a first conductivity type formed in a semiconductor substrate of a second conductivity type. In this case, the collector of the bipolar transistor comprises a high impurity concentration second conductivity type collector layer formed on a surface of the well region. The emitter of the bipolar transistor comprises two high impurity concentration second conductivity type emitter layers formed on the surface of the well region so that the two high impurity concentration second conductivity type emitter layers are separated from and positioned in both sides of the high impurity concentration first conductivity type collector layer. The base of the bipolar transistor comprises two high impurity concentration first conductivity type emitter layers formed on a surface of the semiconductor substrate in the vicinity of the well region so that the two high impurity concentration second conductivity type emitter layers are separated from and positioned in both sides of the two high impurity concentration second conductivity type emitter layers.

A first embodiment according to the present invention will be described in detail with reference to FIG. 3 which is a diagram illustrative of an equivalent circuit of a novel input/output protection circuit in a first embodiment according to the present invention. A novel input/output protection circuit is provided for protecting an internal element 106 from an electrostatic pulse applied to an input/output terminal 102 which is connected to the internal element 106. A series connection of a diode 107 and a p-n-p bipolar transistor 110 is connected between a high voltage power terminal 103 and a low voltage power terminal 104 which is grounded. The diode 107 comprises a high impurity concentration p-type diffusion layer formed in an n-well region. The input/output terminal 102 is connected to an intermediate point between the diode 107 and the p-n-p bipolar transistor 110. An anode of the diode 107 is connected to the high voltage power terminal 103. A cathode of the diode 107 is connected to the input/output terminal 102 and also connected to an emitter of the p-n-p bipolar transistor 110. The emitter of the p-n-p bipolar transistor 110 is then connected to the cathode of the diode 107 and the input/output terminal 102. A collector of the p-n-p bipolar transistor 110 is connected to the low voltage power terminal 104. A base of the p-n-p bipolar transistor 110 is connected through a parasitic n-well resistance 108 to the high voltage power terminal 103. The internal element 106 is also connected between the high voltage power terminal 103 and the ground line.

Figure 4A:
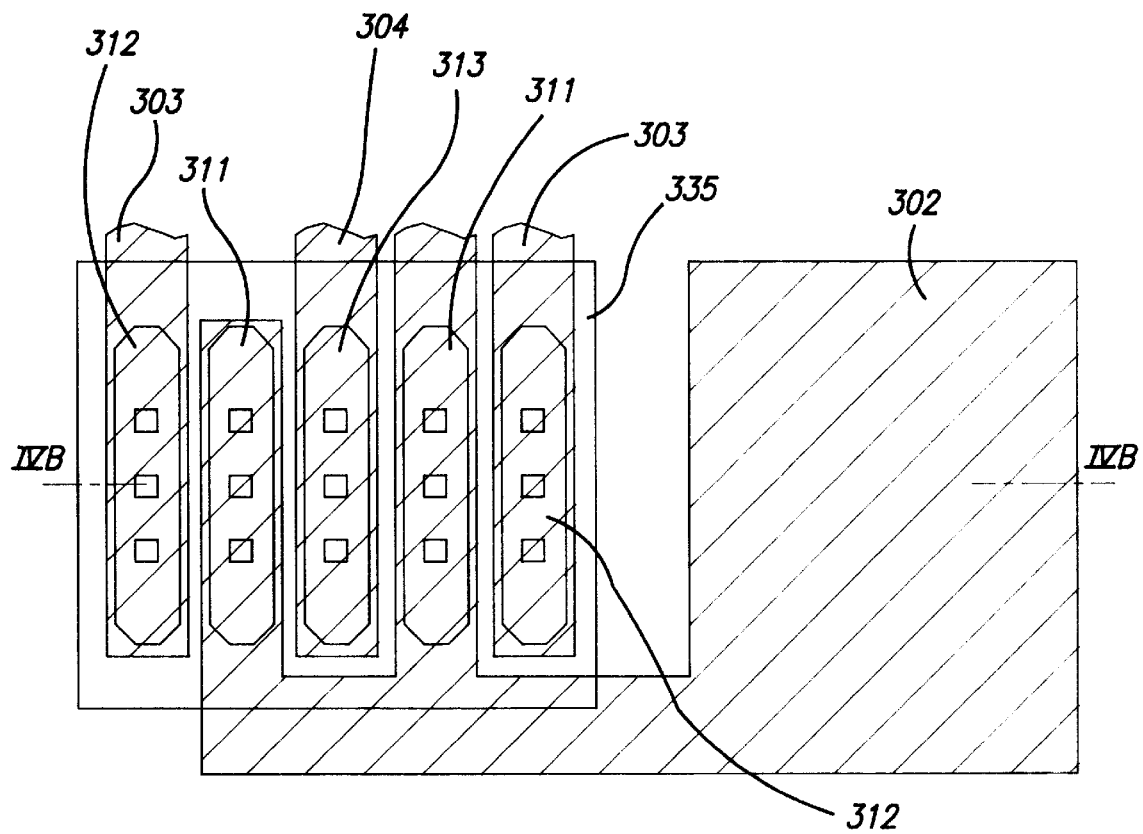
FIG. 4A is a fragmentary plan view illustrative of a novel input/output protection circuit in the first embodiment according to the present invention.
Figure 4B:
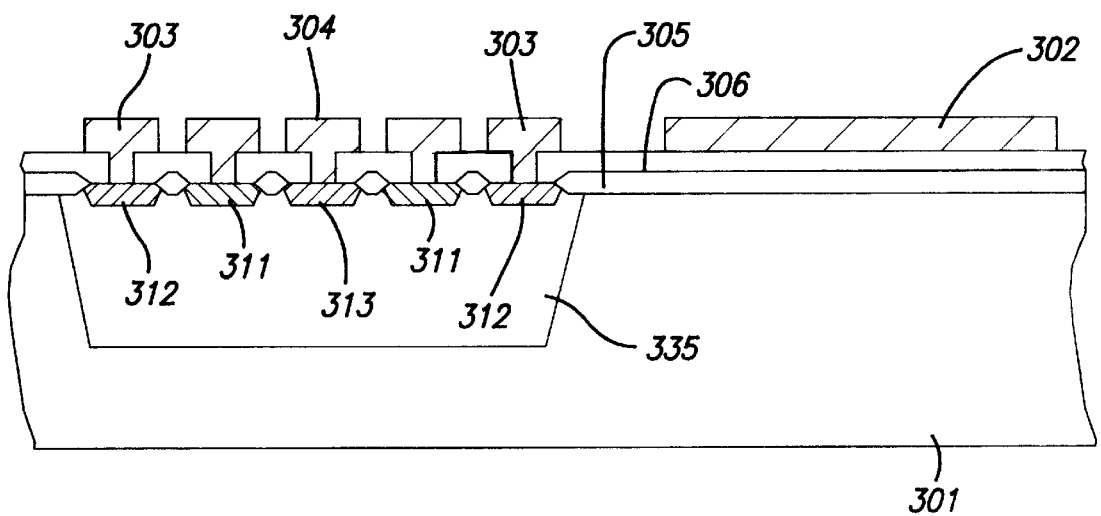
FIG. 4B is a fragmentary cross sectional elevation view illustrative of a novel input/output protection circuit of FIG. 4A.

FIG. 4A is a fragmentary plan view illustrative of a novel input/output protection circuit in the first embodiment according to the present invention. FIG. 4B is a fragmentary cross sectional elevation view illustrative of a novel input/output protection circuit of FIG. 4A. The above novel input/output protection circuit is formed on a p-type semiconductor substrate 301 which has an impurity concentration of $1 \times 10^{14}$ to $1 \times 10^{16}$ atoms/cm$^3$. An n-well 335 is selectively formed in the p-type semiconductor substrate 301. The n-well 335 has a depth of 2–10 micrometers and a surface impurity concentration of $1 \times 10^{15}$ to $1 \times 10^{17}$ atoms/cm$^3$. A field oxide film 305 is selectively formed on the p-type semiconductor substrate 301 to define an active region over the n-well 335. High impurity concentration p-type emitter layers 311 are formed over the n-well 335. The high impurity concentration p-type emitter layers 311 have a depth of 0.2–1 micrometer and a surface impurity concentration of $1 \times 10^{19}$ to $1 \times 10^{20}$ atoms/cm$^3$. The high impurity concentration p-type emitter layers 311 are a pair of parallel stripes in plan view which are distanced from each other. The stripe has a length of 40–400 micrometers and a width of 5–20 micrometers. A high impurity concentration p-type collector layer 313 is formed over the n-well 335. The high impurity concentration p-type collector layer 313 is a single stripe in plan view which is arranged between the pair of the high impurity concentration p-type emitter layers 311 and is parallel to the high impurity concentration p-type emitter layers 311. The stripe has a length of 40–400 micrometers and a width of 5–20 micrometers. The high impurity concentration p-type collector layer 313 is separated by field oxide films 305 from the high impurity concentration p-type emitter layers 311. A distance between the high impurity concentration p-type collector layer 313 and the high impurity concentration p-type emitter layers 311 is 0.1–5 micrometers. The field oxide film 305 has a thickness of 300–1000 nanometers. The high impurity concentration p-type collector layer 313 has a depth of 0.2–1 micrometer and a surface impurity concentration of $1 \times 10^{19}$ to $1 \times 10^{20}$ atoms/cm$^3$. High impurity concentration n-type base layers 312 are formed over the n-well 335. The high impurity concentration n-type base layers 312 have a depth of 0.2–1 micrometer and a surface impurity concentration of $1 \times 10^{19}$ to $1 \times 10^{20}$ atoms/cm$^3$. The high impurity concentration n-type base layers 312 are a pair of stripes in plane view of which are arranged outside the high impurity concentration p-type emitter layers 311 and in parallel to the high impurity concentration p-type emitter layers 311. The stripe has a length of 40–400 micrometers and a width of 5–20 micrometers. The high impurity concentration n-type base layers 312 are separated by the field oxide films 305 from the high impurity concentration p-type emitter layers 311. A distance between the high impurity concentration n-type base layer 312 and the high impurity concentration p-type emitter layer 311 is 0.1–5 micrometers. An inter-layer insulator 306 is further provided which extends over the field oxide films 305 as well as the high impurity concentration p-type emitter layers 311, the high impurity concentration n-type base layers 312 and the high impurity concentration p-type collector layer 313. The inter-layer insulator 306 has contact holes over the high impurity concentration p-type emitter layers 311, the high impurity concentration n-type base layers 312 and the high impurity concentration p-type collector layer 313. High voltage power interconnections 303 are formed over the inter-layer insulator 306 so that the high voltage power interconnections 303 contact the high impurity concentration n-type base layers 312 through the contact holes. A low voltage power interconnection 304 is formed over the inter-layer insulator 306 so that the low voltage power interconnection 304 contacts the high impurity concentration p-type collector layer 313 through the contact holes. An input/output pad 302 is formed which extends over the inter-layer insulator 306 over the p-type semiconductor substrate 301 and the n-well 335. The input/output pad 302 extends over the inter-layer insulator 306 over the high impurity concentration p-type emitter layers 311 so that the input/output pad 302 contacts the high impurity concentration p-type emitter layers 311 through the contact holes. The above elements may be formed in the conventional methods already known by ones skilled in the art to which the invention pertains.

The above five high impurity concentration layers 311, 312 and 313 make a set. One or more sets of the above five high impurity concentration layers 311, 312 and 313 may be formed. When two or more sets of the above five high impurity concentration layers 311, 312 and 313 are formed, then the high impurity concentration n-type base regions 312 in one set may be used commonly to those of the other set.

Figure 3:
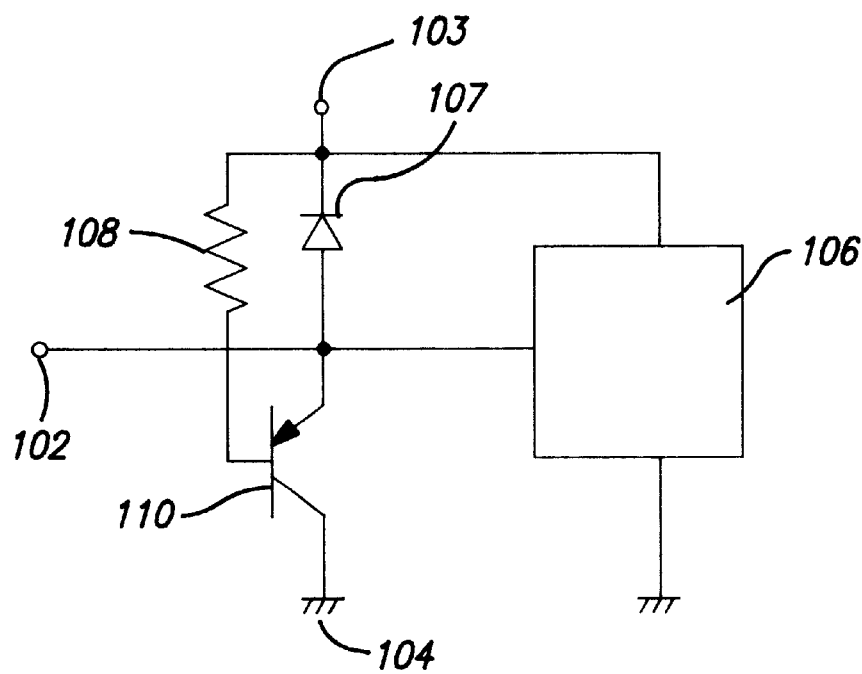
FIG. 3 is a diagram illustrative of an equivalent circuit of an input/output protection circuit in first and second embodiments of the present invention.

The input/output pad 302 of FIG. 4A is connected to the input/output terminal 102 of FIG. 3. The low voltage power interconnection 304 of FIG. 4A is connected to the low voltage power terminal 104 of FIG. 3. The high voltage power interconnections 303 of FIG. 4A are connected to the high voltage power terminal 103 of FIG. 3. The high impurity concentration p-type collector layer 313 is connected through the low voltage power interconnection 304 to the low voltage power terminal 104. The high impurity concentration n-type base layers 312 are connected through the high voltage power interconnections 303 to the high voltage power terminal 103. The high impurity concentration p-type emitter layers 311 are connected through the input/output pad 302 to the input/output terminal 102. Therefore, the p-n-p bipolar transistor is formed between the input/output terminal 102 and the low voltage power terminal 104. Further, the p-n junction between the high impurity concentration p-type emitter layers 311 and the high impurity concentration n-type base layers 312 through the n-well 335 forms the diode 107 between the high voltage power terminal 103 and the input/output terminal 102. The parasitic n-well resistance 108 is formed between the high impurity concentration n-type base layers 312 and the high voltage power interconnections 303.

If the electrostatic pulse is applied to the input/output terminal 102, then the applied electrostatic pulse is clamped by the diode 107 and the p-n-p bipolar transistor 110 whereby the internal element 106 is protected from the applied electrostatic pulse.

In contrast to the conventional input/output protection circuit, it is not necessary to provide, in the n-well, a high impurity concentration p-type diffusion layer connected to the high voltage line, for which reason no parasitic thyristor is formed. This allows the integration of the input/output protection circuit within the n-well region whereby the density of integration of the input/output protection circuit is improved by 20–40%.

A second embodiment according to the present invention will be described in detail again with reference to FIG. 3 which is also a diagram illustrative of an equivalent circuit of a novel input/output protection circuit in second embodiment. The equivalent circuit of the novel input/output protection circuit in this embodiment is substantially the same as that in the first embodiment.

Figure 5A:
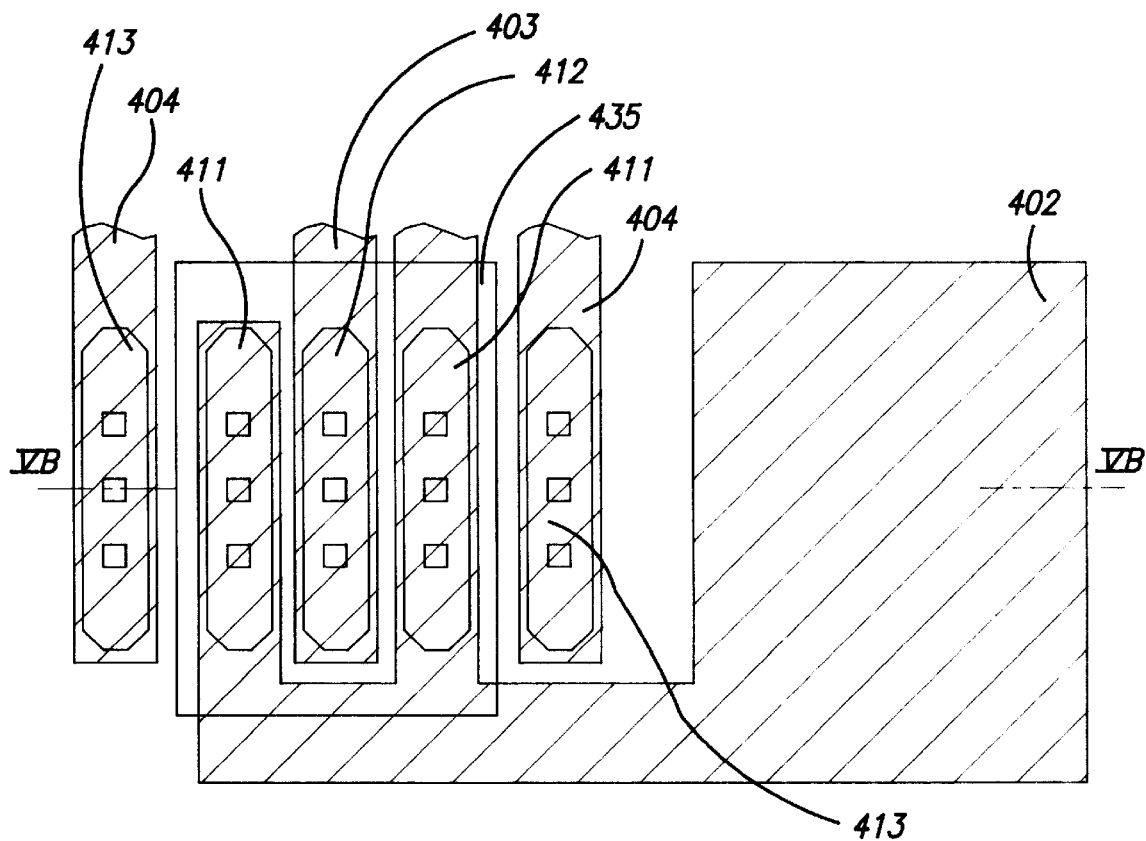
FIG. 5A is a fragmentary plan view illustrative of a novel input/output protection circuit in the second embodiment according to the present invention.
Figure 5B:
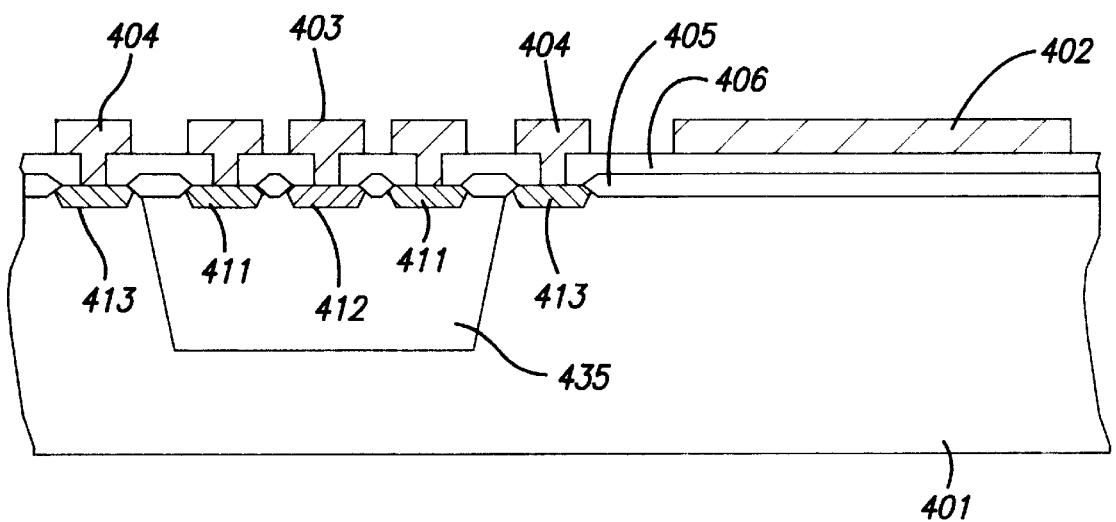
FIG. 5B is a fragmentary cross sectional elevation view illustrative of a novel input/output protection circuit of FIG. 5A.

FIG. 5A is a fragmentary plan view illustrative of a novel input/output protection circuit in the second embodiment according to the present invention. FIG. 5B is a fragmentary cross sectional elevation view illustrative of a novel input/output protection circuit of FIG. 5A. The above novel input/output protection circuit is formed on a p-type semiconductor substrate 401 which has an impurity concentration of $1 \times 10^{14}$ to $1 \times 10^{16}$ atoms/cm$^3$. An n-well 435 is selectively formed in the p-type semiconductor substrate 401. The n-well 435 has a depth of 2–10 micrometers and a surface impurity concentration of $1 \times 10^{15}$ to $1 \times 10^{17}$ atoms/cm$^3$. A field oxide film 405 is selectively formed on the p-type semiconductor substrate 401 to define an active region over the n-well 435. High impurity concentration p-type emitter layers 411 are formed over the n-well 435. The high impurity concentration p-type emitter layers 411 have a depth of 0.2–1 micrometer and a surface impurity concentration of $1 \times 10^{19}$ to $1 \times 10^{20}$ atoms/cm$^3$. The high impurity concentration p-type emitter layers 411 are a pair of parallel stripes in plan view which are distanced from each other. The stripe has a length of 40–400 micrometers and a width of 5–20 micrometers. A high impurity concentration n-type base layer 412 is formed over the n-well 435. The high impurity concentration n-type base layer 412 is a single stripe in plan view which is arranged between the pair of the high impurity concentration p-type emitter layers 411 and is parallel to the high impurity concentration p-type emitter layers 411. The stripe has a length of 40–400 micrometers and a width of 5–20 micrometers. The high impurity concentration n-type base layer 412 is separated by field oxide films 405 from the high impurity concentration p-type emitter layers 411. A distance between the high impurity concentration n-type base layer 412 and the high impurity concentration p-type emitter layers 411 is 0.1–5 micrometers. The field oxide film 405 has a thickness of 300–1000 nanometers. The high impurity concentration n-type base layer 412 has a depth of 0.2–1 micrometer and a surface impurity concentration of $1 \times 10^{19}$ to $1 \times 10^{20}$ atoms/cm$^3$. High impurity concentration p-type collector layers 413 are formed in the p-type semiconductor substrate 401 outside the n-well 435. The high impurity concentration p-type collector layers 413 have a depth of 0.2–1 micrometer and a surface impurity concentration of $1 \times 10^{19}$ to $1 \times 10^{20}$ atoms/cm$^3$. The high impurity concentration p-type collector layers 413 are a pair of stripes in plan view which are arranged outside the high impurity concentration p-type emitter layers 411 and in parallel to the high impurity concentration p-type emitter layers 411. The stripe has a length of 40–400 micrometers and a width of 5–20 micrometers. The high impurity concentration p-type collector layers 413 are separated by the field oxide films 405 from the high impurity concentration p-type emitter layers 411. A distance between the high impurity concentration p-type collector layer 413 and the high impurity concentration p-type emitter layer 411 is 0.1–5 micrometers. An inter-layer insulator 406 is further provided which extends over the field oxide films 405 as well as the high impurity concentration p-type emitter layers 411, the high impurity concentration p-type collector layers 413 and the high impurity concentration n-type base layer 412. The inter-layer insulator 406 has contact holes over the high impurity concentration p-type emitter layers 411, the high impurity concentration p-type collector layers 413 and the high impurity concentration n-type base layer 412. High voltage power interconnections 403 are formed over the inter-layer insulator 406 so that the high voltage power interconnections 403 contact one of the high impurity concentration p-type collector layers 413 and the high impurity concentration n-type base layer 412 through the contact holes. A low voltage power interconnection 404 is formed over the inter-layer insulator 406 so that the low voltage power interconnection 404 contacts another one of the high impurity concentration p-type collector layers 413 through the contact holes. An input/output pad 402 is formed which extends over the inter-layer insulator 406 over the p-type semiconductor substrate 401 and the n-well 435. The input/output pad 402 extends over the inter-layer insulator 406 over the high impurity concentration p-type emitter layers 411 so that the input/output pad 402 contacts the high impurity concentration p-type emitter layers 411 through the contact holes. The above elements may be formed in the conventional methods already known by ones skilled in the art to which the invention pertains.

The above five high impurity concentration layers 411, 412 and 413 make a set. One or more sets of the above five high impurity concentration layers 411, 412 and 413 may be formed. When two or more sets of the above five high impurity concentration layers 411, 412 and 413 are formed, then the high impurity concentration n-type base regions 412 in one set may be used commonly to those of the other set.

The input/output pad 402 of FIG. 5A is connected to the input/output terminal 102 of FIG. 3. The low voltage power interconnections 404 of FIG. 5A are connected to the low voltage power terminal 104 of FIG. 5. The high voltage power interconnection 403 of FIG. 5A is connected to the high voltage power terminal 103 of FIG. 3. The high impurity concentration p-type collector layers 413 are connected through the low voltage power interconnections 404 to the low voltage power terminal 104. The high impurity concentration n-type base layer 412 is connected through the high voltage power interconnections 403 to the high voltage power terminal 103. The high impurity concentration p-type emitter layers 411 are connected through the input/output pad 402 to the input/output terminal 102. Therefore, the p-n-p bipolar transistor is formed between the input/output terminal 102 and the low voltage power terminal 104. Further, the p-n junction between the high impurity concentration p-type emitter layers 411 and the high impurity concentration n-type base layer 412 through the n-well 435 forms the diode 107 between the high voltage power terminal 103 and the input/output terminal 102. The parasitic n-well resistance 108 is formed between the high impurity concentration n-type base layers 412 and the high voltage power interconnections 403.

If the electrostatic pulse is applied to the input/output terminal 102, then the applied electrostatic pulse is clamped by the diode 107 and the p-n-p bipolar transistor 110 whereby the internal element 106 is protected from the applied electrostatic pulse.

In contrast to the conventional input/output protection circuit, it is not necessary to provide, within and in the vicinity of the n-well, a high impurity concentration p-type diffusion layer connected to the high voltage line, for which reason no parasitic thyristor is formed. This allows the integration of the input/output protection circuit within the n-well region whereby the density of integration of the input/output protection circuit is improved by 20–40%.

A third embodiment according to the present invention will be described in detail with reference to FIG. 6 which is a diagram illustrative of an equivalent circuit of a novel input/output protection circuit in the third embodiment. A novel input/output protection circuit is provided for protecting an internal element 106 from an electrostatic pulse applied to an input/output terminal 102 which is connected to the internal element 106. A series connection of a diode 207 and an n-p-n bipolar transistor 210 is connected between a high voltage power terminal 103 and a low voltage power terminal 104 which is grounded. The diode 207 comprises a high impurity concentration n-type diffusion layer formed in a p-well region. The input/output terminal 102 is connected to an intermediate point between the diode 207 and the n-p-n bipolar transistor 210. An anode of the diode 207 is connected to the input/output terminal 102 and also connected to an emitter of the n-p-n bipolar transistor 210. A cathode of the diode 207 is connected to the low voltage power terminal 104. The emitter of the n-p-n bipolar transistor 210 is then connected to the anode of the diode 207 and the input/output terminal 102. A collector of the n-p-n bipolar transistor 210 is connected to the high voltage power terminal 103. A base of the n-p-n bipolar transistor 210 is connected through a parasitic p-well resistance 208 to the low voltage power terminal 104. The internal element 106 is also connected between the high voltage power terminal 103 and the ground line.

Figure 7A:
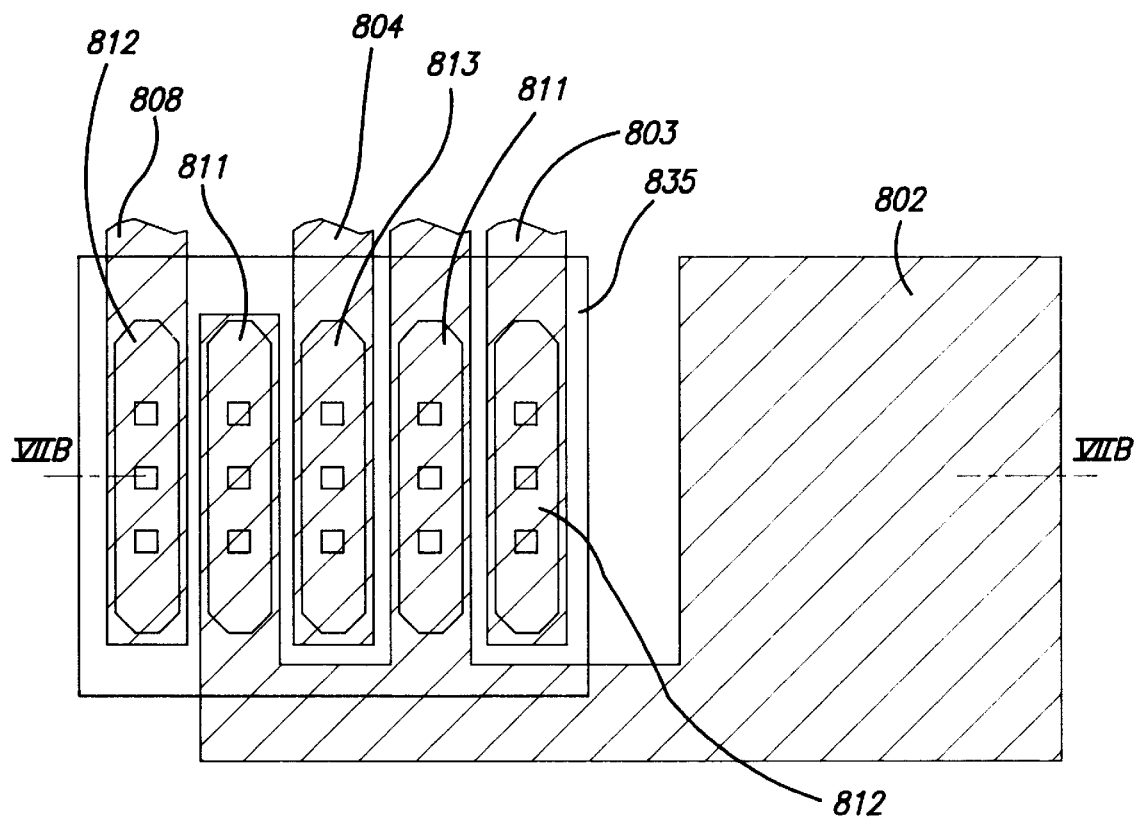
FIG. 7A is a fragmentary plan view illustrative of a novel input/output protection circuit in the third embodiment according to the present invention.
Figure 7B:
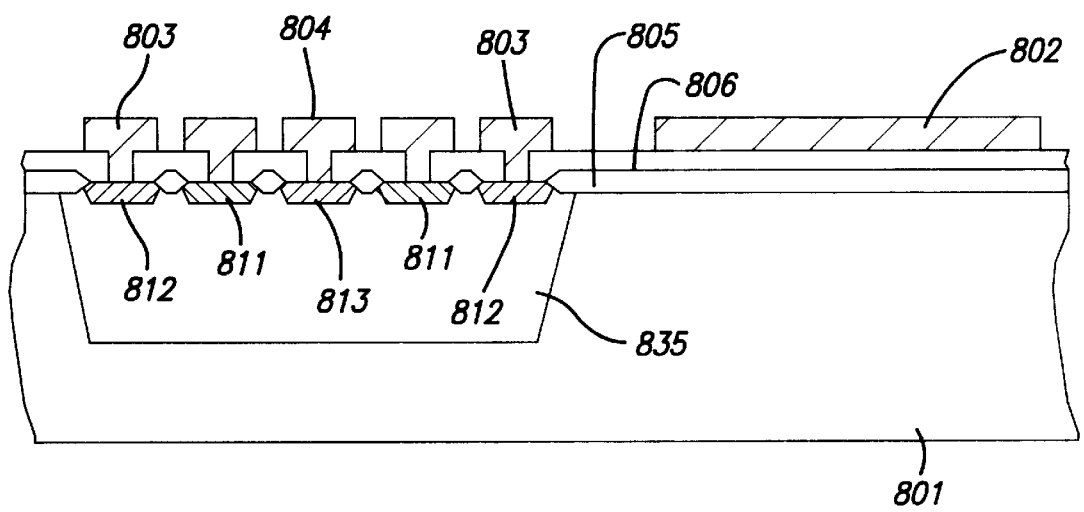
FIG. 7B is a fragmentary cross sectional elevation view illustrative of a novel input/output protection circuit of FIG. 7A.

FIG. 7A is a fragmentary plan view illustrative of a novel input/output protection circuit in the third embodiment. FIG. 7B is a fragmentary cross sectional elevation view illustrative of a novel input/output protection circuit of FIG. 7A. The above novel input/output protection circuit is formed on an n-type semiconductor substrate 801 which has an impurity concentration of $1\times10^{14}$ to $1\times10^{16}$ atoms/cm$^3$. A p-well 835 is selectively formed in the n-type semiconductor substrate 801. The p-well 835 has a depth of 2–10 micrometers and a surface impurity concentration of $1\times10^{15}$ to $1\times10^{17}$ atoms/cm$^3$. A field oxide film 805 is selectively formed on the n-type semiconductor substrate 801 to define an active region over the p-well 835. High impurity concentration n-type emitter layers 811 are formed over the p-well 835. The high impurity concentration p-type emitter layers 811 have a depth of 0.2–1 micrometer and a surface impurity concentration of $1\times10^{19}$ to $1\times10^{20}$ atoms/cm$^3$. The high impurity concentration n-type emitter layers 811 are a pair of parallel stripes in plan view which are distanced from each other. The stripe has a length of 40–400 micrometers and a width of 5–20 micrometers. A high impurity concentration n-type collector layer 813 is formed over the p-well 835. The high impurity concentration n-type collector layer 813 is a single stripe in plane view which is arranged between the pair of the high impurity concentration n-type emitter layers 811 and is parallel to the high impurity concentration n-type emitter layers 811. The stripe has a length of 40–400 micrometers and a width of 5–20 micrometers. The high impurity concentration n-type collector layer 813 is separated by field oxide films 805 from the high impurity concentration n-type emitter layers 811. A distance between the high impurity concentration p-type collector layer 813 and the high impurity concentration n-type emitter layers 811 is 0.1–5 micrometers. The field oxide film 805 has a thickness of 300–1000 nanometers. The high impurity concentration n-type collector layer 813 has a depth of 0.2–1 micrometer and a surface impurity concentration of $1\times10^{19}$ to $1\times10^{20}$ atoms/cm$^3$. High impurity concentration p-type base layers 812 are formed over the p-well 835. The high impurity concentration p-type base layers 812 have a depth of 0.2–1 micrometer and a surface impurity concentration of $1\times10^{19}$ to $1\times10^{20}$ atoms/cm$^3$. The high impurity concentration p-type base layers 812 are a pair of stripes shapes in plan view which are arranged outside the high impurity concentration n-type emitter layers 811 and in parallel to the high impurity concentration n-type emitter layers 811. The stripe has a length of 40–400 micrometers and a width of 5–20 micrometers. The high impurity concentration p-type base layers 812 are separated by the field oxide films 805 from the high impurity concentration n-type emitter layers 811. A distance between the high impurity concentration p-type base layer 812 and the high impurity concentration n-type emitter layer 811 is 0.1–5 micrometers. An inter-layer insulator 806 is further provided which extends over the field oxide films 805 as well as the high impurity concentration n-type emitter layers 811, the high impurity concentration type base layers 812 and the high impurity concentration n-type collector layer 813. The inter-layer insulator 806 has contact holes over the high impurity concentration n-type emitter layers 811, the high impurity concentration p-type base layers 812 and the high impurity concentration n-type collector layer 813. Low voltage power interconnections 803 are formed over the inter-layer insulator 806 so that the low voltage power interconnections 803 contacts the high impurity concentration p-type base layers 812 through the contact holes. A high voltage power interconnection 804 is formed over the inter-layer insulator 806 so that the high voltage power interconnection 804 contacts the high impurity concentration n-type collector layer 813 through the contact holes. An input/output pad 802 is formed which extends over the inter-layer insulator 806 over the n-type semiconductor substrate 801 and the p-well 835. The input/output pad 802 namely extends over the inter-layer insulator 806 over the high impurity concentration n-type emitter layers 811 so that the input/output pad 802 contacts the high impurity concentration n-type emitter layers 811 through the contact holes. The above elements may be formed in the conventional methods already known by ones skilled in the art to which the invention pertains.

The above five high impurity concentration layers 811, 812 and 813 make a set. One or more sets of the above five high impurity concentration layers 811, 812 and 813 may be formed. When two or more sets of the above five high impurity concentration layers 811, 812 and 813 are formed, then the high impurity concentration p-type base regions 812 in one set may be used commonly to those of the other set.

Figure 6:
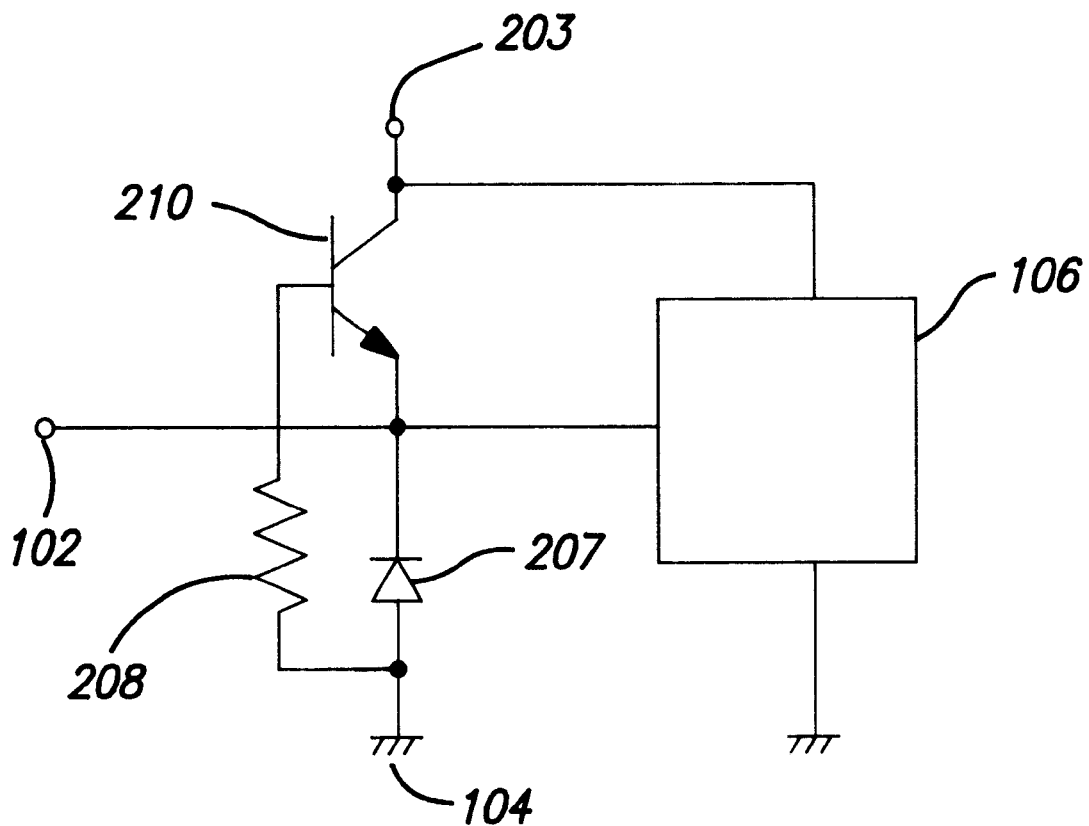
FIG. 6 is a diagram illustrative of an equivalent circuit of an input/output protection circuit in third and fourth embodiment of the present invention.

The input/output pad 802 of FIG. 7A is connected to the input/output terminal 102 of FIG. 6. The low voltage power interconnection 804 of FIG. 7A is connected to the low voltage power terminal 104 of FIG. 6. The high voltage power interconnections 803 of FIG. 7A are connected to the high voltage power terminal 103 of FIG. 6. The high impurity concentration n-type collector layer 813 is connected through the high voltage power interconnection 804 to the high voltage power terminal 103. The high impurity concentration p-type base layers 812 are connected through the low voltage power interconnections 803 to the low voltage power terminal 104. The high impurity concentration n-type emitter layers 811 are connected through the input/output pad 802 to the input/output terminal 102. Therefore, the n-p-n bipolar transistor is formed between the input/output terminal 102 and the high voltage power terminal 103. Further, the p-n junction between the high impurity concentration n-type emitter layers 811 and the high impurity concentration p-type base layers 812 through the p-well 835 forms the diode 207 between the low voltage power terminal 104 and the input/output terminal 102. The parasitic p-well resistance 108 is formed between the high impurity concentration p-type base layers 812 and the low voltage power interconnections 803.

If the electrostatic pulse is applied to the input/output terminal 102, then the applied electrostatic pulse is clamped by the diode 207 and the n-p-n bipolar transistor 210 whereby the internal element 106 is protected from the applied electrostatic pulse.

In contrast to the conventional input/output protection circuit, it is not necessary to provide, in the p-well, a high impurity concentration n-type diffusion layer connected to the high voltage line, for which reason no parasitic thyristor is formed. This allows the integration of the input/output protection circuit within the p-well region whereby the density of integration of the input/output protection circuit is improved by 20–40%.

A fourth embodiment according to the present invention will be described in detail with reference again to FIG. 9 which is also a diagram illustrative of an equivalent circuit of a novel input/output protection circuit in the fourth embodiment.

Figure 8A:
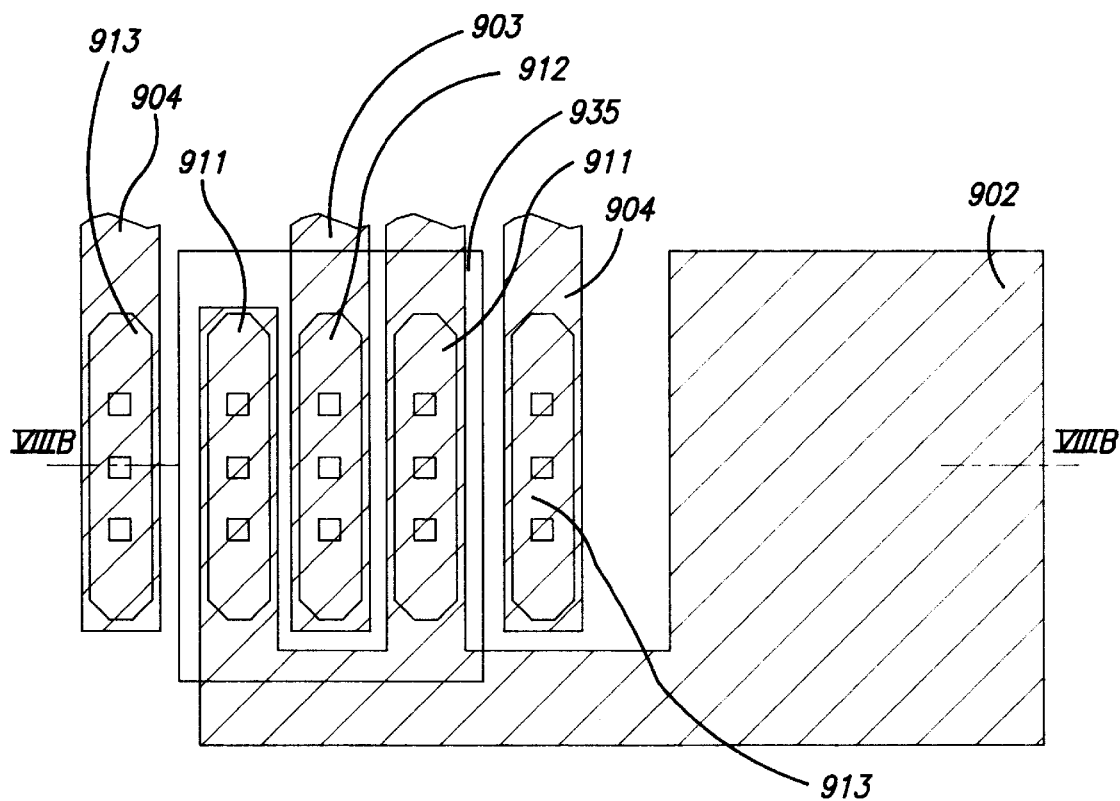
FIG. 8A is a fragmentary plan view illustrative of a novel input/output protection circuit in the fourth embodiment according to the present invention.
Figure 8B:
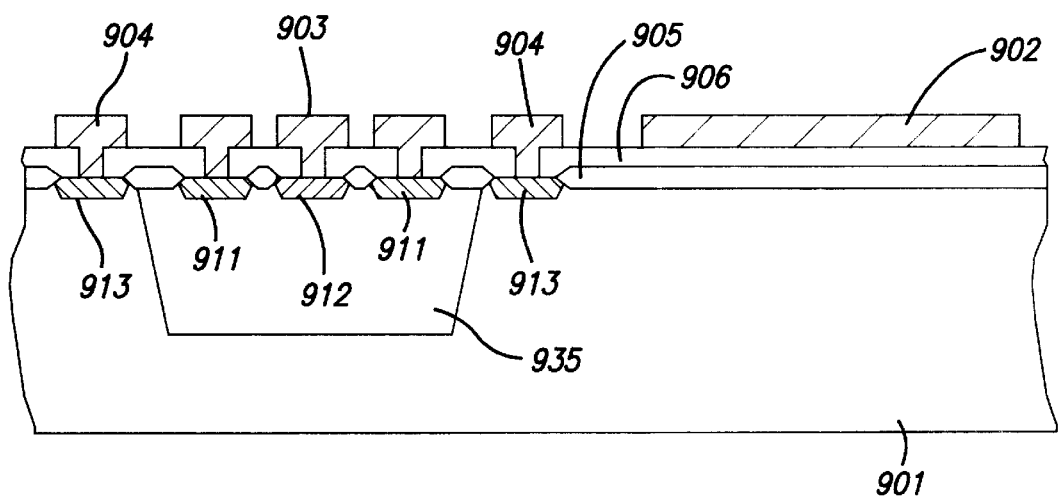
FIG. 8B is a fragmentary cross sectional elevation view illustrative of a novel input/output protection circuit of FIG. 8A.

FIG. 8A is a fragmentary plan view illustrative of a novel input/output protection circuit in the fourth embodiment. FIG. 8B is a fragmentary cross sectional elevation view illustrative of a novel input/output protection circuit of FIG. 8A. The above novel input/output protection circuit is formed on an n-type semiconductor substrate 901 which has an impurity concentration of $1\times10^{14}$ to $1\times10^{16}$ atoms/cm$^3$. A p-well 935 is selectively formed in the p-type semiconductor substrate 901. The p-well 935 has a depth of 2–10 micrometers and a surface impurity concentration of $1\times10^{15}$ to $1\times10^{17}$ atoms/cm$^3$. A field oxide film 905 is selectively formed on the n-type semiconductor substrate 901 to define an active region over the p-well 935. High impurity concentration n-type emitter layers 911 are formed over the p-well 935. The high impurity concentration n-type emitter layers 911 have a depth of 0.2–1 micrometer and a surface impurity concentration of $1\times10^{19}$ to $1\times10^{20}$ atoms/cm$^3$. The high impurity concentration n-type emitter layers 911 are a pair of stripes in plan view which are arranged distanced from each other. The stripe has a length of 40–400 micrometers and a width of 5–20 micrometers. A high impurity concentration p-type base layer 912 is formed over the p-well 935. The high impurity concentration p-type base layer 912 has a single stripe in plan view which is arranged between the pair of the high impurity concentration n-type emitter layers 911 and is in parallel to the high impurity concentration n-type emitter layers 911. The stripe has a length of 40–400 micrometers and a width of 5–20 micrometers. The high impurity concentration p-type base layer 912 is separated by field oxide films 905 from the high impurity concentration n-type emitter layers 911. A distance between the high impurity concentration p-type base layer 912 and the high impurity concentration n-type emitter layers 911 is 0.1–5 micrometers. The field oxide film 905 has a thickness of 300–1000 nanometers. The high impurity concentration p-type base layer 912 has a depth of 0.2–1 micrometer and a surface impurity concentration of $1\times10^{19}$ to $1\times10^{20}$ atoms/cm$^3$. High impurity concentration n-type collector layers 913 are formed in the n-type semiconductor substrate 901 outside the p-well 935. The high impurity concentration n-type collector layers 913 have a depth of 0.2–1 micrometer and a surface impurity concentration of $1\times10^{19}$ to $1\times10^{20}$ atoms/cm$^3$. The high impurity concentration n-type collector layers 913 are a pair of stripes in plan view which are arranged outside the high impurity concentration n-type emitter layers 911 and in parallel to the high impurity concentration n-type emitter layers 911. The stripe has a length of 40–400 micrometers and a width of 5–20 micrometers. The high impurity concentration n-type collector layers 913 are separated by the field oxide films 905 from the high impurity concentration n-type emitter layers 911. A distance between the high impurity concentration n-type collector layer 913 and the high impurity concentration n-type emitter layer 911 is 0.1–5 micrometers. An inter-layer insulator 906 is further provided which extends over the field oxide films 905 as well as the high impurity concentration n-type emitter layers 911, the high impurity concentration n-type collector layers 913 and the high impurity concentration p-type base layer 912. The inter-layer insulator 906 has contact holes over the high impurity concentration n-type emitter layers 911, the high impurity concentration n-type collector layers 913 and the high impurity concentration p-type base layer 912. High voltage power interconnections 903 are formed over the inter-layer insulator 906 so that the high voltage power interconnections 903 contact one of the high impurity concentration n-type collector layers 913 and the high impurity concentration p-type base layer 912 through the contact holes. A low voltage power interconnection 904 is formed over the inter-layer insulator 906 so that the low voltage power interconnection 904 contacts another one of the high impurity concentration n-type collector layers 913 through the contact holes. An input/output pad 902 is formed which extends over the inter-layer insulator 906 over the n-type semiconductor substrate 901 and the p-well 935. The input/output pad 902 extends over the inter-layer insulator 906 over the high impurity concentration n-type emitter layers 911 so that the input/output pad 902 contacts the high impurity concentration n-type emitter layers 911 through the contact holes. The above elements may be formed in the conventional methods already known by ones skilled in the art to which the invention pertains.

The above five high impurity concentration layers 911, 912 and 913 make a set. One or more sets of the above five high impurity concentration layers 911, 912 and 913 may be formed. When two or more sets of the above five high impurity concentration layers 911, 912 and 913 are formed, then the high impurity concentration p-type base regions 912 in one set may be used commonly to those of the other set.

The input/output pad 902 of FIG. 8A is connected to the input/output terminal 102 of FIG. 6. The high voltage power interconnections 904 of FIG. 8A are connected to the high voltage power terminal 103 of FIG. 6. The low voltage power interconnection 903 of FIG 8A is connected to the low voltage power terminal 104 of FIG. 6. The high impurity concentration n-type collector layers 913 are connected through the high voltage power interconnections 904 to the high voltage power terminal 103. The high impurity concentration p-type base layer 912 is connected through the low voltage power interconnections 903 to the low voltage power terminal 104. The high impurity concentration n-type emitter layers 911 are connected through the input/output pad 902 to the input/output terminal 102. Therefore, the n-p-n bipolar transistor is formed between the input/output terminal 102 and the high voltage power terminal 103. Further, the p-n junction between the high impurity concentration n-type emitter layers 911 and the high impurity concentration p-type base layer 912 through the p-well 935 forms the diode 107 between the low voltage power terminal 104 and the input/output terminal 102. The parasitic p-well resistance 208 is formed between the high impurity concentration p-type base layers 912 and the low voltage power interconnections 904.

If the electrostatic pulse is applied to the input/output terminal 102, then the applied electrostatic pulse is clamped by the diode 207 and the n-p-n bipolar transistor 210 whereby the internal element 106 is protected from the applied electrostatic pulse.

In contrast to the conventional input/output protection circuit, it is not necessary to provide, within and in the vicinity of the p-well, a high impurity concentration n-type diffusion layer connected to the high voltage line, for which reason no parasitic thyristor is formed. This allows the integration of the input/output protection circuit within the p-well region whereby the density of integration of the input/output protection circuit is improved by 20–40%.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An input/output circuit for electrically protecting an internal element, the circuit comprising:

an input/output terminal connected to the internal element;

a pair of first and second power terminals applied with a bias voltage;

a series connection of a diode and a bipolar transistor connected between the pair of first and second power terminals so that an intermediate point between the diode and the bipolar transistor is connected to the input/output terminal;

a parasitic resistance connected between a base of the bipolar transistor and the diode so that the diode is connected between the parasitic resistance and an emitter of the bipolar transistor, wherein at least portions of each of the bipolar transistor, the diode and the parasitic resistance are interrelated within a single well region of a first conductivity type in a semiconductor substrate of a second conductivity type, wherein a collector of the bipolar transistor comprises a high impurity concentration second conductivity type collector layer on a surface of the well region, wherein the emitter of the bipolar transistor comprises two high impurity concentration second conductivity type emitter layers on the surface of the well region so that the two high impurity concentration second conductivity type emitter layers are separated from and positioned on both sides of the high impurity concentration second conductivity type collector layer, and wherein the base of the bipolar transistor comprises two high impurity concentration first conductivity type base layers on the surface of the well region so that the two high impurity concentration first conductivity type base layers are separated from and positioned on both sides of the two high impurity concentration second conductivity type emitter layers, whereby an electrostatic pulse applied to the input/output terminal is clamped by the series connection of the diode and the bipolar transistor so as to protect the internal element from an electrostatic pulse applied to the input/output terminal.

2. The input/output circuit as claimed in claim 1, wherein the first power terminal has a first voltage level which is higher than a second voltage level of the second power terminal, the bipolar transistor is a p-n-p bipolar transistor, the diode is connected between the first power terminal and the emitter of the bipolar transistor, and the collector of the bipolar transistor is connected to the second power terminal.

3. The input/output circuit as claimed in claim 1, wherein the first power terminal has a first voltage level which is higher than a second voltage level of the second power terminal, the bipolar transistor is an n-p-n bipolar transistor, the diode is connected between the second power terminal and the emitter of the bipolar transistor, and the collector of the bipolar transistor is connected to the first power terminal.

4. An input/output circuit for electrically protecting an internal element, the circuit comprising:

an input/output terminal for being connected to an internal element to be protected by the circuit;

first and second power terminals;

a diode and a bipolar transistor connected in series between the first and second power terminals so that an intermediate point between the diode and the bipolar transistor is connected to the input/output terminal;

a parasitic resistance connected between a base of the bipolar transistor and the diode so that the diode is connected between the parasitic resistance and an emitter of the bipolar transistor, wherein at least portions of each of the bipolar transistor, the diode and the parasitic resistance are in a single well region of a first conductivity type in a semiconductor substrate of a second conductivity type, wherein said bipolar transistor comprises a set of parallel, spaced-apart stripes on a surface of the well region, the set of stripes including a first stripe of the second conductivity type that is a collector of the bipolar transistor, a pair of second stripes of the second conductivity type that are the emitter of the bipolar transistor, and pair of third stripes of the first conductivity type that are the base of the bipolar transistor, whereby an electrostatic pulse applied to the input/output terminal is clamped by the series connection of the diode and the bipolar transistor so as to protect the internal element from an electrostatic pulse applied to the input/output terminal.

5. The circuit of claim 4, wherein said first stripe is between said pair of second stripes and said pair of second stripes is between said pair of third stripes.

6. The circuit of claim 4, wherein each of said stripes in said set of stripes has an impurity concentration of $10^{19}$ to $10^{20}$ atoms/cm$^3$.

* * * * *